(12) United States Patent
Chandra

(10) Patent No.: US 7,663,516 B1
(45) Date of Patent: Feb. 16, 2010

(54) SCHEME FOR NON-LINEARITY CORRECTION OF RESIDUE AMPLIFIERS IN A PIPELINED ANALOG-TO-DIGITAL CONVERTER (ADC)

(75) Inventor: Gaurav Chandra, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/197,347

(22) Filed: Aug. 25, 2008

(51) Int. Cl.
*H03M 1/10* (2006.01)
(52) U.S. Cl. .................. 341/120; 341/161; 341/162
(58) Field of Classification Search ............ 341/120, 341/161
See application file for complete search history.

(56) References Cited

U.S. PATENT DOCUMENTS

| | | | |
|---|---|---|---|
| 6,642,871 B2 * | 11/2003 | Takeyabu et al. | 341/120 |
| 6,778,126 B2 * | 8/2004 | Ali | 341/156 |
| 7,002,506 B1 | 2/2006 | Tadeparthy et al. | |
| 7,142,138 B2 * | 11/2006 | Chen et al. | 341/120 |

OTHER PUBLICATIONS

Chong-Min Kyung & Choong-Ki Kim, "Pipeline Analog-to-Digital Conversoin with Charge-Coupled Devices", IEEE Journal of Solid-State Circuits, vol. SC-15, No. 2, Apr. 1980, pp. 255-257.
Stephen H. Lewis & Paul R. Gray, "A Pipelined 5-Msample/s 9-bit Analog-to-Digital Converter", IEEE Journal of Solid-State Circuits, vol. SC-22, No. 6, Dec. 1987, pp. 954-961.
Stephen H. Lewis et al, "A 10-b 20-Msample/s Analog-to-Digital Converter", IEEE Journal of Solid-State Circuits, vol. 27, No. 3, Mar. 1992, pp. 351-358.
B. Murmann and B.E. Boser, "A 12-b 75-MS/s pipelined ADC using open-loop residue amplification", IEEE Journal of Solid-State Circuits, vol. 38, No. 12, Dec. 2003, pp. 2040-2050.
J. Li and U.K. Moon, "Background calibration techniques for multi-stage pipelined ADCs with digital redundancy", IEEE Trans. Circuits Sys. II, Analog Digit. Signal Process., vol. 50, No. 9, Sep. 2004, pp. 531-538.

* cited by examiner

*Primary Examiner*—Khai M Nguyen
(74) *Attorney, Agent, or Firm*—Ronald O. Neerings; Wade James Brady, III; Frederick J. Telecky, Jr.

(57) ABSTRACT

In a method and apparatus for compensating non-linearity of a gain of a residual amplifier (RA), a pipelined analog-to-digital converter (ADC) converts an analog input to a digital output (DO). The ADC includes a plurality of pipelined stages (PPS). Each stage, which includes an instance of the RA, provides a digital code corresponding to an output of the RA included in a preceding stage. A memory stores a piece-wise linear representation for modeling the non-linearity of the gain. A calibrated gain of the RA corresponding to each region of a plurality of linear operating regions of the RA is stored in the memory. A gain adjuster adjusts the digital code for each one of the PPS in accordance with a gain factor derived from the calibrated gain for each one of the PPS. A constructor constructs the DO from the adjusted digital code received from each one of the PPS.

20 Claims, 6 Drawing Sheets

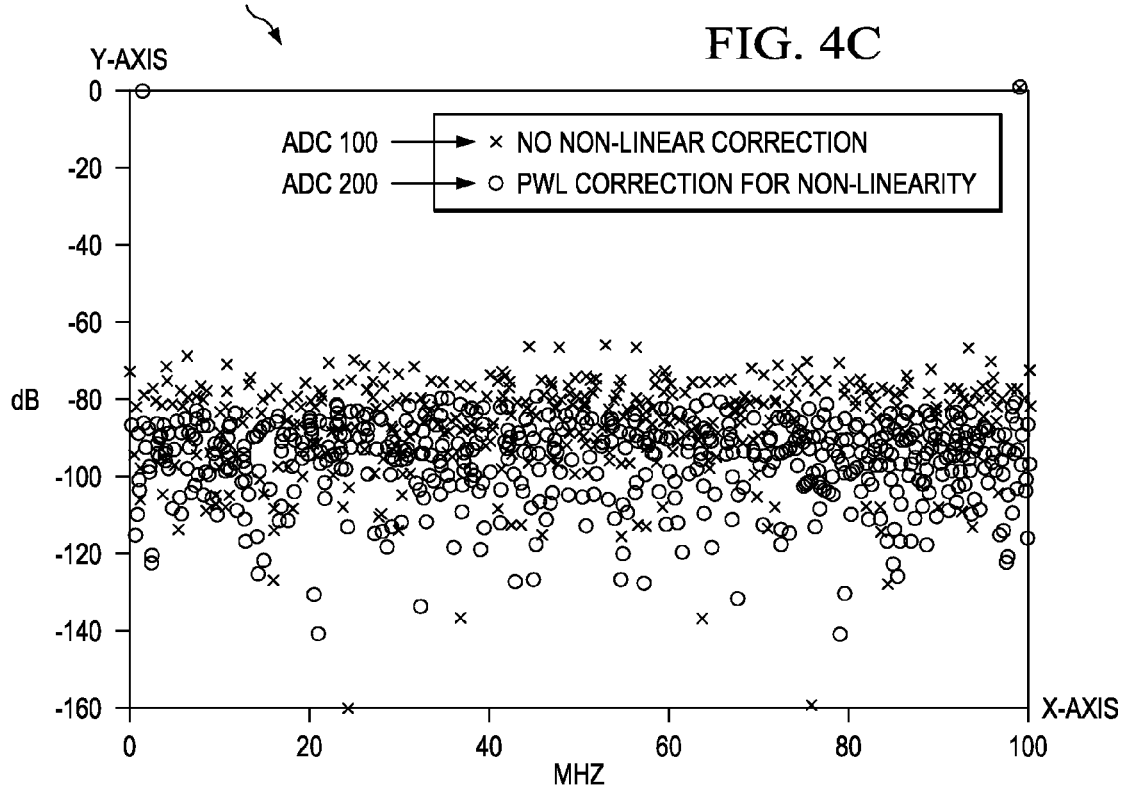

SCHEME FOR NON-LINEARITY CORRECTION OF RESIDUE AMPLIFIERS IN A PIPELINED ANALOG-TO-DIGITAL CONVERTER (ADC)

BACKGROUND

The present disclosure relates generally to an analog-to-digital converter (ADC) used in electronic circuits, and more particularly to a method and an apparatus for improving the performance of pipelined ADC's.

An ADC is generally used to sample an analog signal at various time instances, and generate a digital code representing the strength of the sampled analog signal at the corresponding time instance. A pipelined ADC is a type of ADC which contains multiple (pipelined) stages, with each stage resolving a number of bits forming a digital sub-code. The digital sub-codes generated by various stages are used to generate a digital code corresponding to the analog input.

FIG. 1A is a block diagram illustrating a pipelined ADC 100, according to prior art. The ADC 100 is shown containing a sample and hold amplifier (SHA) 110, a plurality of pipelined stages 120 (e.g., stage 122 through stage 128), and a digital error correction block 130. In some configurations of the ADC 100, the SHA 110 may be excluded. The SHA 110 samples an analog input signal received at an input terminal coupled to a conductive path 134 and holds the voltage level of the sample for further processing. Each one of the plurality of pipelined stages 120 generates a digital sub-code corresponding to a voltage level of an analog signal received as an input, and an amplified residue signal provided as an analog input to a downstream stage. For example, stage 112 converts a voltage level present on path 111 to generate a digital sub-code provided to the digital error correction block 130 via path 132, and the amplified residue signal is provided as an analog input to stage 124 via path 112.

The digital error correction block 130 receives digital sub-codes from each one of the plurality of stages 120, and generates a digital code corresponding to the analog input signal sample received via paths 132, 134, and 138 respectively. Essentially, the digital error correction block 130 performs a weighted addition of the sub-codes to generate the overall code, as is well known in the relevant arts. The generated digital code is provided to an external circuit via path 146.

FIG. 1B illustrates a block diagram of each stage included in a plurality of pipelined stages described with reference to FIG. 1A, according to prior art. Each one of the plurality of stages 120 (including stage 122 through stage 128) is shown to contain flash ADC 150, digital to analog converter (DAC) 160, subtractor 170 and gain amplifier 180. Flash ADC 150 (an example of a sub ADC) converts a sample of an analog signal received on an input path, e.g., path 111, into a corresponding P-bit sub-code provided on path 156 (contained in path 132 of FIG. 1A, and P is less than N). DAC 160 converts the sub-code received on path 156 into corresponding analog signal (Vdac) on path 168.

Subtractor 170 generates a residue signal 178 as the difference of sample 111 (Vi) and the analog signal received on path 168 (Vdac). Gain amplifier 180 amplifies the residue signal 178 (Vi-Vdac) and is provided on an output path, e.g., path 112, as an amplified residue signal. The signal on path 112 is used to resolve the remaining bits in the N-bit digital code by the subsequent ADC stages. Subtractor 170, DAC 160, and gain amplifier 180 may be implemented using a capacitor network and an operational amplifier.

As noted above, ADCs need to be generated with low bit errors. Digital error correction block 130 may correct for errors in the sub-codes to a limited extent. Specifically, small errors in the comparator reference voltages may be corrected by the digital error correction block 130. However, some (typically large) errors in the sub-codes may not be entirely corrected due to various limitations of digital error correction block 130.

One source of error in the sub-code, commonly known as gain error, is due to a non-accurate gain in each stage. Gain error and settling error in each stage of the plurality of stages 120 typically leads to non-linearity in the overall A/D transfer characteristics. This results in stringent gain error and bandwidth specifications for the operational amplifiers implementing the gain amplifier 180. Typically, the power dissipation of a pipelined ADC is dominated by the plurality of stages 120. As noted above, in a stage having P bit resolution, the ideal gain of the gain amplifier 180 needs to be 2P (where  represents the 'to the power of' operation). Any deviation from this value leads to non-linearity that may not be corrected by the digital error correction block 130.

The pipelined ADC 100 described with reference to FIGS. 1A and 1B, may include compensation for small gain errors but generally does not include compensation for non-linearity errors. One solution to compensate for non-linear gain uses complex algorithms and complex digital filters (not shown) to correct the non-linearity once it has been estimated. Such a solution, however, requires very large complexity of the digital circuits, which require large silicon areas and increased power for implementation. For example, one implementation of the solution requires a complete, off-chip, digital post-processing system (not shown) to correct the non-linearity of the gain. Therefore, a need exists to provide an improved pipelined ADC that compensates for non-linearity of gain in each stage preferably without incurring a substantial penalty in noise performance, cost, power consumption, and silicon area.

SUMMARY

Applicants recognize that known techniques of applying inverse non-linear filters having smoothly varying values to correct known non-linearity in the gain may be theoretically possible but are impractical. For example, filters using inverse cosine function and large lookup tables (stored in large amounts of memory) are required to represent the smoothly varying inverse non-linear characteristics of the gain. The need for large silicon areas and increased power for implementation of such complex algorithms makes the solution impractical to be used in a mixed circuit environment, especially in high speed communication applications. Therefore, it would be desirable to provide an improved technique for modeling non-linear gain in a residual amplifier that is efficient in terms of simplicity in design and implementation, silicon area usage, power consumption usage, noise performance, and cost. Accordingly, it would be desirable to provide a method and apparatus for compensating non-linearity of a gain of a residual amplifier used in a pipelined ADC, absent the disadvantages found in the prior methods discussed above.

The foregoing needs are addressed by the teachings of the present disclosure, which relates to an apparatus and method for improving the performance of pipelined ADC's. According to one embodiment, in an apparatus and method for compensating non-linearity of a gain of a residual amplifier (RA), a pipelined analog-to-digital converter (ADC) converts an analog input to a digital output (DO). The ADC includes a plurality of pipelined stages (PPS). Each stage, which includes an instance of the RA, provides a digital code corresponding to an output of the RA included in a preceding stage. A memory stores a piecewise linear representation for modeling the non-linearity of the gain. A calibrated gain of the RA corresponding to each region of a plurality of linear operating regions of the RA is stored in the memory. A gain adjuster adjusts the digital code for each one of the PPS in accordance with a gain factor derived from the calibrated gain for each one of the PPS. A constructor constructs the DO from the adjusted digital code received from each one of the PPS.

In one aspect of the disclosure, a method for compensating non-linearity of a gain of a residual amplifier includes, modeling a piecewise linear (PWL) representation for the non-linearity of the gain by segmenting the residual amplifier to operate in a plurality of linear operating regions. The PWL representation defines a calibrated gain corresponding to each one of the plurality of linear operating regions. A digital code corresponding to an output of the residual amplifier is received. The PWL representation is accessed to identify a region of the plurality of linear operating regions corresponding to the output. The calibrated gain from the PWL representation corresponding to the region is retrieved. The digital code is divided by a gain factor to provide an adjusted digital code, the gain factor being derived from the calibrated gain.

Several advantages are achieved by the method and apparatus according to the illustrative embodiments presented herein. The embodiments provide an improved method and apparatus for reducing gain error in a pipelined ADC introduced as a result of non-linear gain of a residual amplifier (RA) included in each stage of the ADC. The technique provides a piecewise linear (PWL) representation for modeling the non-linearity of the gain of the RA. Depending on an input to the RA, the RA is segmented to operate in one of a plurality of linear operating regions. The PWL representation defines a calibrated gain corresponding to each one of the plurality of linear operating regions. An average value of the calibrated gain corresponding to each one of the plurality of linear operating regions is stored in memory. A digital code for each stage of the ADC is adjusted for the non-linear gain in accordance with a gain factor derived from the calibrated gain for each stage. A digital output of the ADC is constructed from the adjusted digital code received from each stage. In a benchmarking test for comparing performance of: 1) a pipelined ADC with ideal (linear) amplifier, 2) a pipelined ADC with non-linear gain of amplifier, e.g., ADC 100, and 3) a pipelined ADC with PWL compensation for the non-linear gain of amplifier, a signal to noise ratio (SNR) for each of the three cases is 73 dB, 56 dB, and 65 dB respectively. Thus, a dramatic 9 dB improvement in the SNDR is achieved for the improved method and apparatus for reducing non-linear gain error compared to the traditional pipelined ADC 100 having a SNR of 56 dB. Thus, the improved piecewise linearization technique advantageously provides modeling of the non-linear gain in the RA that is efficient in terms of simplicity in design and implementation, silicon area usage, power consumption usage, noise performance, and cost.

BRIEF DESCRIPTION OF THE DRAWINGS

FIG. 4C is a graph 430 illustrating improvement in noise performance of a pipelined ADC with non-linear gain correction described with reference to FIGS. 2A, 2B, 3A, and 3B, according to an embodiment.

DETAILED DESCRIPTION

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, sub-assemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Figure 1A:
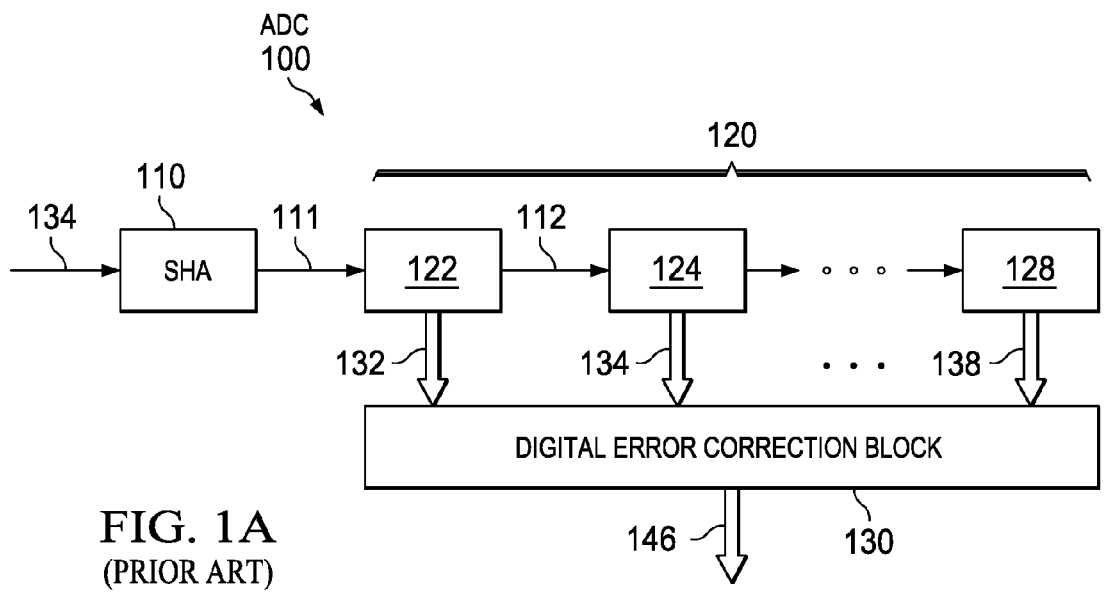
FIG. 1A illustrates a block diagram of a pipelined ADC, described herein above, according to prior art.
Figure 1B:
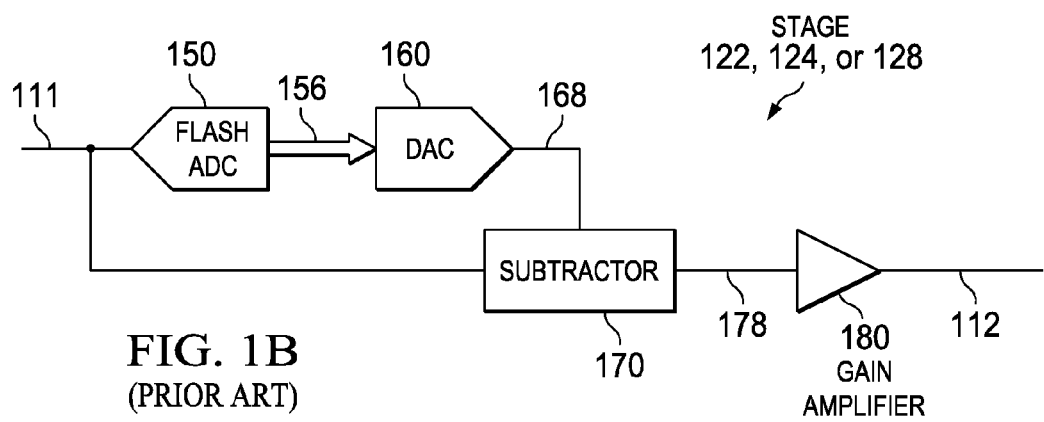
FIG. 1B a block diagram of each stage included in a plurality of pipelined stages described with reference to FIG. 1A, described herein above, according to prior art.

The typical pipelined ADC 100 described with reference to FIGS. 1A and 1B typically does not include techniques to compensate for non-linear gain of amplifiers. One solution to compensate for the non-linear gain of the amplifier uses complex algorithms and complex digital filters to correct the non-linearity once it has been estimated. Such a solution, however, requires very large complexity of the digital circuits including use of off-chip processors, which require large silicon areas and increased power for implementation. Therefore, a need exists to provide a method and apparatus for modeling non-linear gain in a residual amplifier that is efficient in terms of simplicity in design and implementation, silicon area usage, power consumption usage, noise performance, and cost. This problem may be addressed by an improved apparatus and method for compensating non-linearity of a gain of a residual amplifier used in a pipelined ADC.

According to one embodiment, in an apparatus and method for compensating non-linearity of a gain of a residual amplifier (RA), a pipelined analog-to-digital converter (ADC) converts an analog input to a digital output (DO). The ADC includes a plurality of pipelined stages (PPS). Each stage, which includes an instance of the RA, provides a digital code corresponding to an output of the RA included in a preceding stage. A memory stores a piecewise linear representation for modeling the non-linearity of the gain. A calibrated gain of the RA corresponding to each region of a plurality of linear operating regions of the RA is stored in the memory. A gain adjuster adjusts the digital code for each one of the PPS in accordance with a gain factor derived from the calibrated gain for each one of the PPS. A constructor constructs the DO from the adjusted digital code received from each one of the PPS.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more integrated circuits (ICs) packaged into a module.

Configuration—Describes a set up of an element, a circuit, a package, an electronic device, and similar other, and refers to a process for setting, defining, or selecting particular properties, parameters, or attributes of the device prior to its use or operation. Some configuration attributes may be selected to have a default value. For example, a gain of an amplifier may be configured to be equal to one (1) to enable an output signal to simply track an input signal.

Amplifier—An electronic circuit that draws power from a power source to boost or amplify one or more input signals. Some amplifiers may be configured to simply track or isolate an input signal without providing amplification. Some of the desirable amplifier characteristics include high input impedance, high gain, and low output impedance. Amplifiers may be configured in multiple topologies including cascade, cascode, differential, and similar others to achieve desired characteristics. A gain of an ideal amplifier is linear. That is, a ratio of an output of the amplifier to an input of the amplifier is equal to a constant. A gain of non-ideal amplifiers is non-linear. That is, a ratio of an output of the amplifier to an input of the amplifier is variable in dependence of a region of operation. A level of the input or output within a specified range generally defines a region of operation of the amplifier.

Gain and non-linearity error in an ADC—A gain error of an ADC indicates how well a slope of an actual linear transfer function matches the slope of an ideal linear transfer function. Thus, a gain error causes the actual transfer function slope to deviate from the ideal slope. Gain error is the full-scale error minus the offset error. When offset and gain errors are compensated for, the actual transfer function should be equal to the transfer function of a perfect ADC. However, non-linearity in the ADC may cause the actual curve to deviate slightly from the perfect curve, even if the two curves are equal around 0 and at the point where the gain error was measured. Thus, a non-linearity error of a pipelined ADC indicates a deviation (positive or negative) between an actual transfer function from an ideal transfer function (a straight line).

A semiconductor device apparatus in the form of an improved pipelined ADC having an improved residual amplifier that includes a correction for non-linear gain is described with reference to FIGS. 2A and 2B. Additional details of the improved residual amplifier that includes a correction for non-linear gain is described with reference to FIGS. 3A and 3B. A method for compensating non-linearity of a gain of a residual amplifier is described with reference to FIG. 5. FIGS. 4A, 4B, and 4C illustrate in a graphical form performance of the improved pipelined ADC described with reference to FIGS. 2A, 2B, 3A, and 3B compared to a traditional pipelined ADC described with reference to FIGS. 1A and 1B.

Figure 2A:
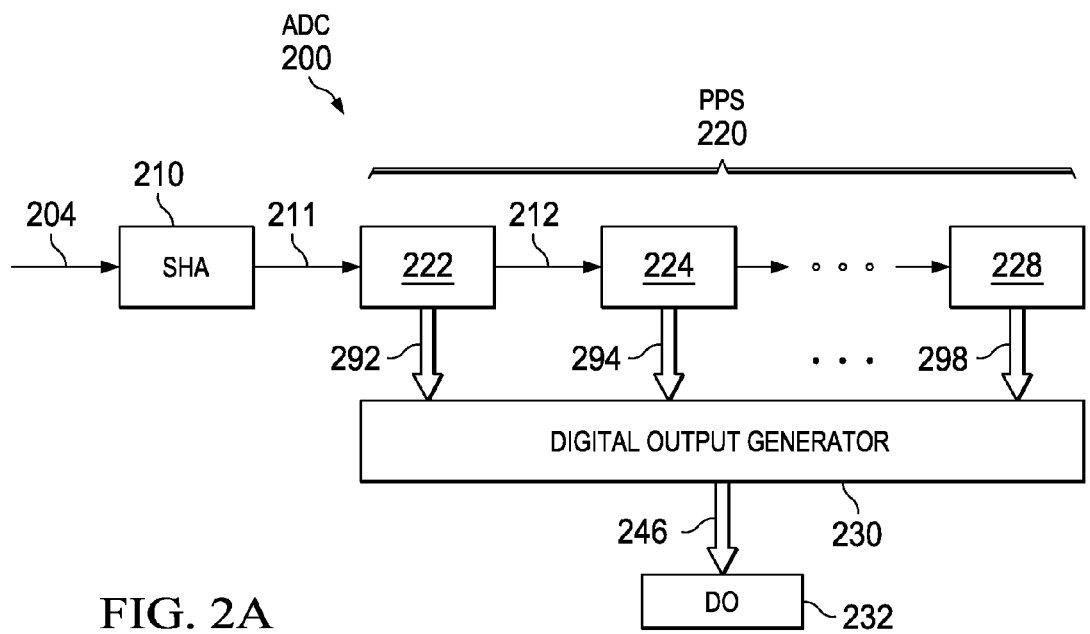
FIG. 2A illustrates a block diagram of an improved pipelined analog-to-digital converter (ADC), according to an embodiment.
Figure 2B:
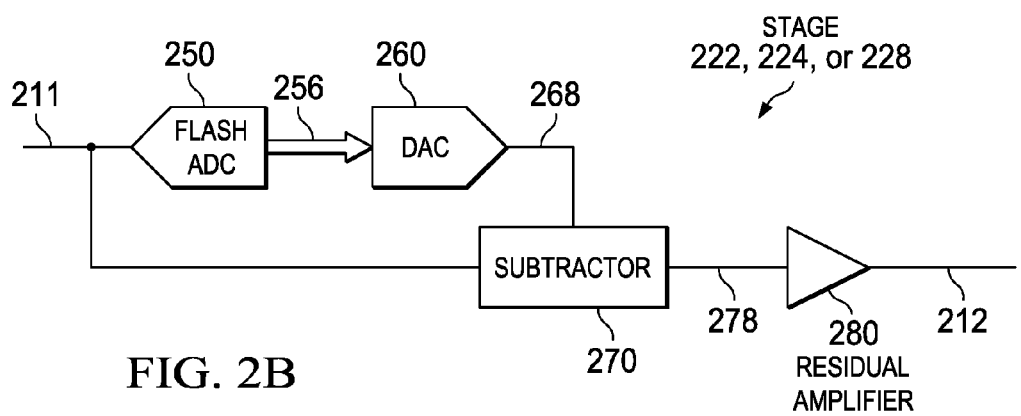
FIG. 2B illustrates a block diagram of each stage included in a plurality of pipelined stages of an ADC described with reference to FIG. 2A, according to an embodiment.

FIG. 2A illustrates a block diagram of an improved pipelined analog-to-digital converter (ADC) 200, according to an embodiment. The pipelined ADC 200 includes a sample and hold amplifier (SHA) 210, a plurality of pipelined stages (PPS) 220 (e.g., stage 222 through stage 228 shown), and a digital output generator 230. The number of stages included in the PPS 200 may vary between 1 and n, where n is an integer. In an embodiment, at least one of the PPS 220 has a non-linear gain and the digital output generator 230 includes techniques to reduce the effects of the non-linear gain on the performance of the ADC 200. The pipelined ADC 200 is operable to convert an analog input signal to an equivalent digital output.

The SHA 210 samples an analog input signal received at an input terminal coupled to a conductive path 204 and holds the voltage level of the sample for further processing. Each one of the plurality of pipelined stages PPS 220 generates a digital code corresponding to a voltage level of an analog signal received as an input, and an amplified residue signal provided as an analog input to a downstream stage. For example, stage 222 converts a voltage level present on path 211 to generate a digital code provided to the digital output generator 230 via path 292, and the amplified residue signal is provided as an analog input to stage 224 via path 212. The amplified residue signal corresponds to a full range signal for an adjacent downstream stage.

The digital output generator 230 receives digital codes from each one of the plurality of pipelined stages PPS 220 via conductive paths 292, 294, and 298, adjusts the digital codes by a corresponding gain factor (GF) to compensate for the non-linear gain, and generates a combined digital code or digital output DO 232 from the adjusted digital codes. The DO 232 corresponds to the digital equivalent of the analog input signal sample received via path 204. The DO 232 which includes the compensation for the non-linear gain is provided as an output on the path 246. The digital output DO 232 is generated from the digital codes D1, D2, D3, ... and Dn provided by each the PPS 220 as defined by Equation 100:

$$DO = D1 + D2/GF1 + D3/(GF1*GF2) + \ldots + Dn/(GF1*GF2* \ldots *GFn-1)$$  Equation 100 where GF1, GF2, and GFn−1 are the gain factors associated with the amplifiers of stage 1, stage 2, and stage (n−1), and D2, D3, and Dn are the digital codes generated by stage 2, stage 3 and stage n respectively.

Gain factors GF1, GF2, and GFn−1 are a function of the digital code D2, D3, and Dn generated by a downstream stage. That is, the gain factor corresponding to a particular stage is dependent on a calibrated gain for a particular stage and each stage preceding the particular stage, e.g., GF1 is a function of D2, GF2 is a function of D3 and so on. Since the first stage 222 receives the sampled input directly from the SHA 210 there is no amplification and hence no gain factor associated with D1 digital code. Also, the final stage 228 providing Dn output may not be configured to include an amplifier since there are no additional downstream stages. Additional details of the digital output generator 230 are described with reference to FIGS. 3A, 3B, 4C and 5.

In a particular embodiment, the pipelined ADC 200 may be configured with the PPS 220, with each stage being configured using a 3-bit flash sub ADC, to provide a 9-bit digital output (e.g., n=9). That is, the DO 232 digital output includes 9-bits of information to convert an analog input signal to a digital equivalent. In this embodiment, the number of PPS 220 are equal to 3, with the first stage 222 generating a first 3-bit digital code, the second stage 224 generating a second 3-bit digital code, the third or last stage 228 generating a third 3-bit digital code. It is understood that the number of bits used for the overall analog-to-digital conversion may be different than 9-bits depending on the application. Similarly, the number of bits used per stage may be different than 3-bits depending on the application.

FIG. 2B illustrates a block diagram of each stage included in a plurality of pipelined stages of an ADC described with reference to FIG. 2A, according to an embodiment. Each one of the plurality of pipelined stages 220 (including stage 222 through stage 228) is shown to include a flash ADC 250, digital to analog converter (DAC) 260, subtractor 270 and residual amplifier (RA) 280. As described earlier, although all stages of the PPS 200 are generally identical, some stages of the PPS 220 may be configured to exclude some of the components. For example, in some applications the RA 280, which may be physically present, may be excluded from the configuration of the last stage 228 since there is no need to further amplify the residual analog signal. Flash ADC 250 (an example of a sub ADC) converts a sample of an analog signal received on an input path, e.g., path 211 shown, into a corresponding p-bit digital code provided to path 256 (included in path 292 of FIG. 2A, and p is less than n, with the DO 232 having n-bits). DAC 260 converts the digital code received on path 256 into corresponding analog signal (Vdac) on path 268.

Subtractor 270 generates a residue signal 278 as the difference of sample 211 (Vi) and the analog signal received on path 268 (Vdac). Residual amplifier RA 280 amplifies the residue signal 278 (Vi-Vdac) and is provided to an output path, e.g., path 212, as an amplified residue signal. The signal provided to the output path, e.g., path 212, is used to resolve the remaining bits in the n-bit digital code by the subsequent ADC stages. In a particular embodiment, the subtractor 270, DAC 260, and RA 280 may be implemented using a capacitor network and an operational amplifier.

Figure 3A:
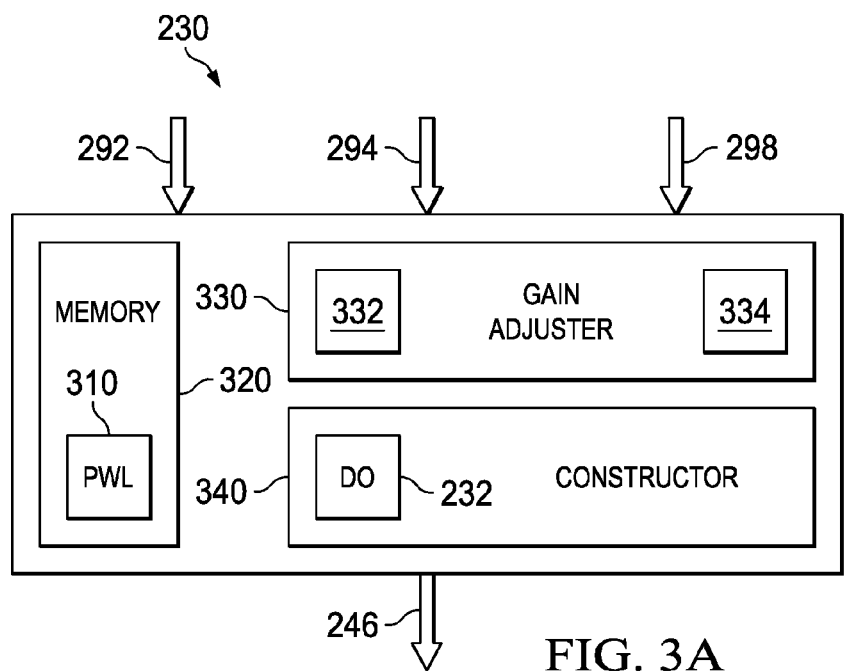
FIG. 3A illustrates a block diagram of a digital output generator described with reference to FIGS. 2A and 2B, according to an embodiment.
Figure 4A:
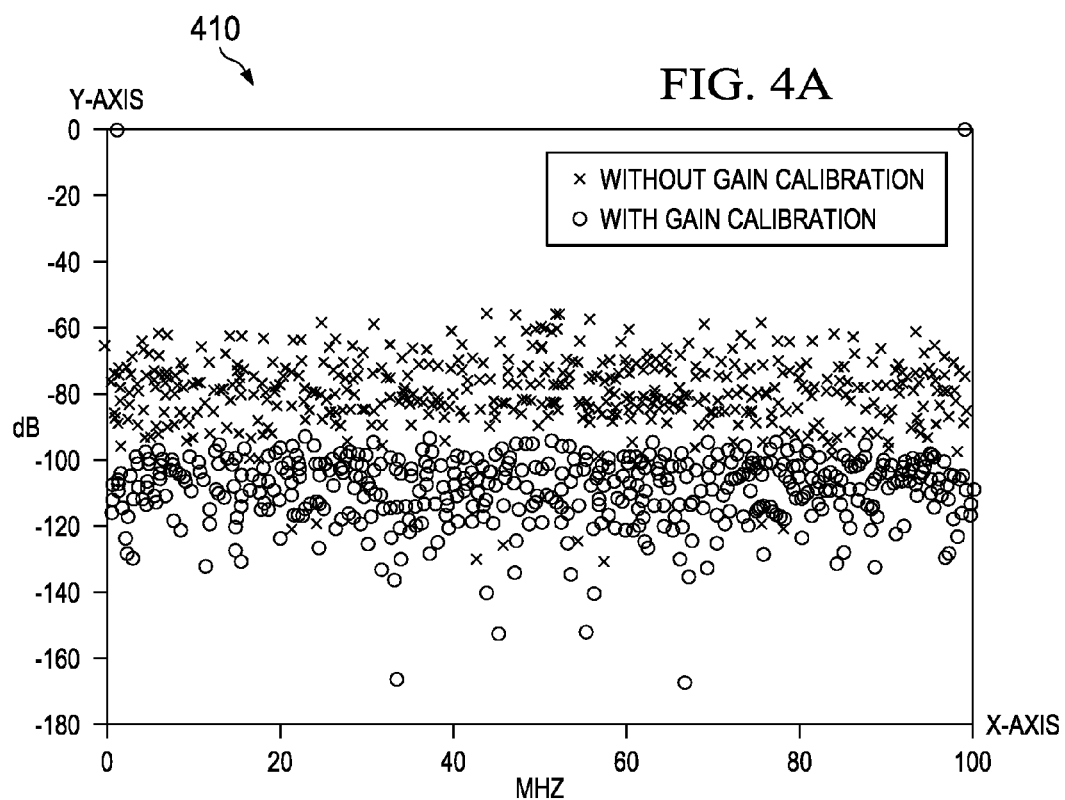
FIG. 4A is a graph illustrating noise performance of a pipelined ADC 100 with and without gain error correction described with reference to FIGS. 1A and 1B.
Figure 4B:
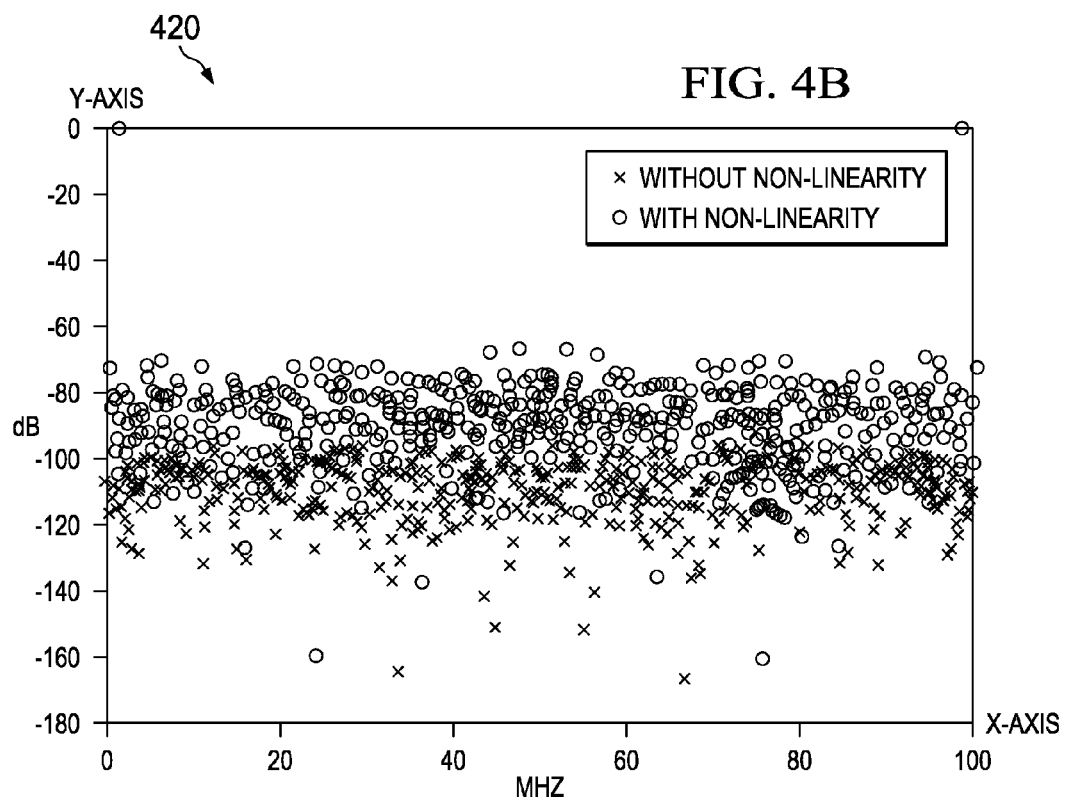
FIG. 4B is a graph illustrating degradation in noise performance of a pipelined ADC with gain error correction and having non-linearity described with reference to FIGS. 1A and 1B.

FIG. 3A illustrates a block diagram of a digital output generator described with reference to FIGS. 2A and 2B, according to an embodiment. In the depicted embodiment, the digital output generator 230 includes a piecewise linear (PWL) 310 representation that models the known non-linearity of the gain of RA 280 included in each stage, a memory 320 operable to store the PWL 310 representation, a gain adjuster 330 to adjust the digital code for the non-linearity of the gain, and a constructor 340 to construct the DO 232 from the adjusted digital code. The PWL 310 representation defines that an input to output relationship is piecewise linear, e.g., is linear within each operating region. In a particular embodiment, the digital output generator 230 is implemented in the digital domain. That is, all input, output, and internal signals associated with the digital output generator 230 are digital.

Figure 3B:
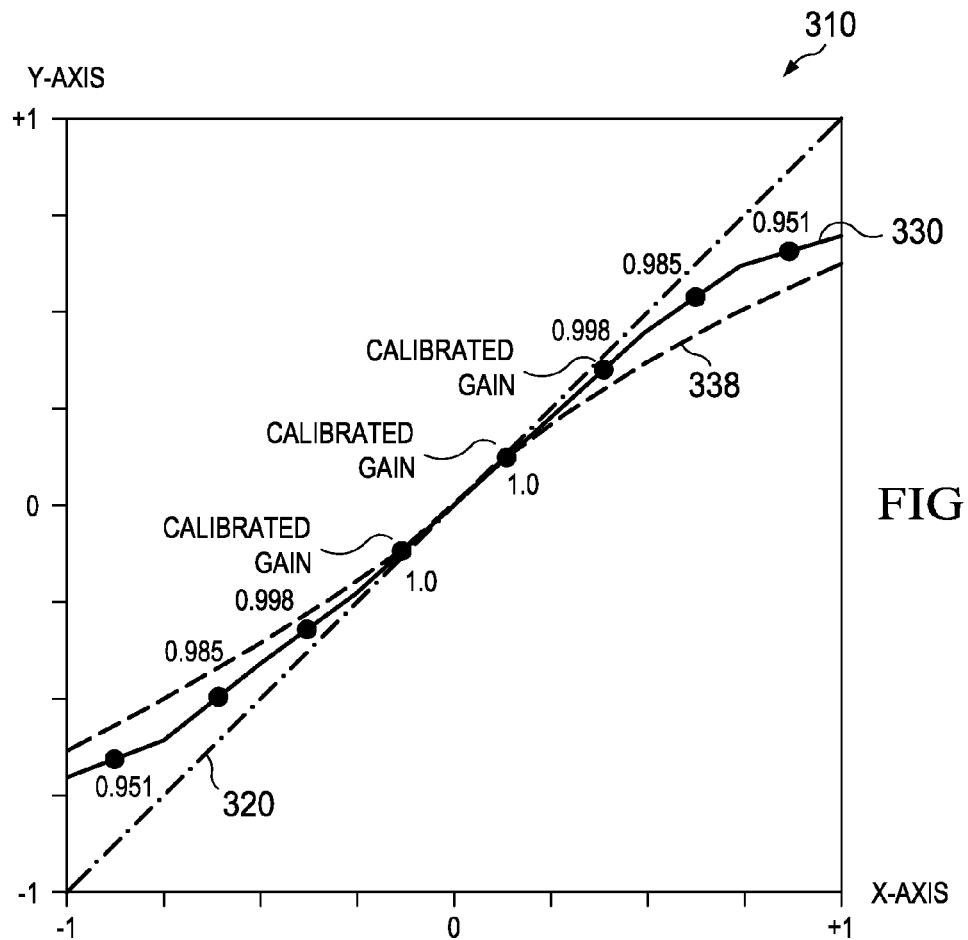
FIG. 3B illustrates in graphical form a PWL representation to model a known non-linearity of a gain of a residual amplifier described with reference to FIG. 3A, according to an embodiment.

FIG. 3B illustrates in graphical form a PWL representation to model a known non-linearity of a gain of a residual amplifier described with reference to FIG. 3A, according to an embodiment. Referring to FIGS. 3A and 3B, the PWL 310 representation illustrated in FIG. 3B may be derived by use of techniques including modeling and simulation, testing, amplifier circuit analysis, and similar others. If the residual amplifier included in each stage is identical then only one PWL representation for the ADC may be desired. If the residual amplifier included in each stage is not identical then each residual amplifier included in each stage of the PPS 220 may have a separate corresponding PWL representation. The PWL 310 includes normalized input (X-axis) values varying from −1 to +1 and normalized output (Y-axis) values varying from −1 to +1. In an exemplary, non-depicted embodiment, the PWL 310 may include normalized output (X-axis) values varying from −1 to +1 and normalized input (Y-axis) values varying from −1 to +1.

A graph 320 represents a normalized linear gain of an ideal amplifier corresponding to each operating region. The graph 320 is a straight line and the slope of the graph 310 is a constant equal to 1. The PWL 310 also includes a graph 330 which includes a plurality of linear segments that approximate the known non-linearity of the RA 280 instead of using a continuous smooth curve 338. That is, the graph 330 displays an input to output relationship that is not linear from end-to-end, but is segmented into a plurality of operating regions each of which exhibit a linear relationship between the input and the output. Such a representation is described as being piecewise linear (PWL). The slope of the graph 330 in each operating region is constant, and the graph 330 displays a calibrated gain corresponding to each region of a plurality of linear operating regions of the RA 280. A number of regions included in the plurality of linear operating regions of the RA 280 is equal to 2 raised to n, n being equal to a number of bits per stage of the pipelined ADC 200, n being an integer. In the depicted embodiment, the PWL 310 includes 8 (2**3) linear operating regions corresponding to the 3-bit flash used in each stage. It is understood that the number of operating regions included in the PWL 310 may vary depending on the number of bits used in each stage.

In an embodiment, an average value of the calibrated gain corresponding to each one of the plurality of linear operating regions is stored in the PWL 310 as a constant in memory 320, e.g., may stored as tabular data. For a particular value of an analog input or an analog output of an amplifier, the graph 330 may be used to determine a corresponding value of the calibrated gain. For example, the value of the calibrated gain for the operating region [0.75-1.0] on X-axis is stored as the constant 0.951 and for the operating region [0.5-0.75] on X-axis is stored as the constant 0.985.

In a particular embodiment, the gain adjuster 330 adjusts the digital code in accordance with a gain factor derived from the calibrated gain for each one of the PPS 220, the gain adjuster 330 providing an adjusted digital code for each one of the PPS 220. For example, the gain adjuster 330 receives the digital code D2 for stage 2 224, D3 from stage 3, and Dn for the last stage 228. Using the digital code received (which corresponds to an analog output of a preceding stage) the gain adjuster 330 accesses PWL 310 data to determine operating region and corresponding calibrated gain. Thus, the memory 320 storing the data for PWL 310 may be accessed by the gain adjuster 330 using a particular value of an analog output of RA 280 included in stage P (received as an analog input to stage (P+1) and corresponding to Dp+1 digital code generated by stage P+1), e.g., a normalized value of 0.77, to obtain a corresponding calibrated gain value of 0.951 stored in a table.

Modeling the continuous smooth curve 338 depicting the non-linearity is avoided by use of approximation with piecewise linearization technique, thereby substantially decreasing the complexity of the implementation. Since the analog output of stage P is digitized by the subsequent (P+1) pipelined stage, information regarding the region of operation of the residue amplifier RA 280 used in stage P is available from the stage P as an amplified residual analog input to stage (P+1). Thus, information regarding the region of operation of the RA 280 included in any stage may be used to choose the corresponding calibrated gain value for the gain adjuster 330. For example, based on the digital code output by the second stage, e.g., D2 output by stage 224, an appropriate calibrated gain for the first stage 222 may be determined from the PWL 310 and used in the gain adjuster 330.

For a fully differential residual amplifier only the odd order harmonics may be of interest and hence the non-linearity is anti-symmetric about the center point, as illustrated by graph 330. Hence only half the values of the calibrated gain may be stored. Thus, for the PWL 310 having 8 linear operating regions, only 4 calibrated values for the RA 280 included in stage P need to be stored in the memory 320 (and represented as 4 different digital multipliers). If no symmetry is present, then a number of calibrated values that are stored in memory 320 may double from 4 to 8, e.g., corresponding to a number of linear operating regions of the RA 280. Therefore, the simplified implementation of ADC 200 using just 4 registers to store the 4 calibrated gain values advantageously provides modeling of the non-linear gain in the RA that is efficient in terms of simplicity in design and implementation, silicon area usage, power consumption usage, noise performance, and cost.

In a particular embodiment, the gain adjuster 330 includes a divider 332 and a multiplier 334. The divider 332 is operable to perform a divide operation by performing a shift right operation on the digital code, the gain factor being expressed as a multiple of 2. If the gain factor cannot be expressed as a multiple of 2, then the divider 332 is operable to perform a divide operation by performing a shift right operation on the digital code and the multiplier 334 is operable to perform a multiplication operation on the right shifted digital code. The gain adjuster 330 adjusts the digital code for each stage by dividing the digital code by the corresponding gain factor, e.g., D2/GF1 as described with reference to Equation 100, to obtain an adjusted digital code. As described with reference to Equation 100, the gain factor GFp for stage p of the pipelined ADC 200 is derived by a multiplication of calibrated gains corresponding to stages p through p minus 1, p being an integer. The constructor 340 receives the adjusted digital code from each stage, e.g., D2/GF1, D3/(GF1*GF2), and similar others, and constructs the digital output DO 232. The digital output DO 232 of the ADC 200 is constructed by concatenating the adjusted digital code corresponding to each one of the multiple ones of the stages arranged in accordance with the pipelined ADC 200.

FIG. 4A is a graph 410 illustrating noise performance of a pipelined ADC 100 with and without gain error correction described with reference to FIGS. 1A and 1B. FIG. 4B is a graph 420 illustrating degradation in noise performance of a pipelined ADC with gain error correction and having non-linearity described with reference to FIGS. 1A and 1B. FIG. 4C is a graph 430 illustrating improvement in noise performance of a pipelined ADC 200 with non-linear gain correction described with reference to FIGS. 2A, 2B, 3A, and 3B, according to an embodiment.

Referring to FIGS. 4A, 4B, and 4C, the values used to construct graphs 410, 420, and 430 may be derived using tools and techniques including modeling and simulation, testing, circuit analysis, and similar others. A 12-bit pipelined ADC design having a first stage with a 4-bit flash ADC and a gain of 8 (3 effective bits) is used for the comparison. In a pipeline ADC design, it is desirable that the quantization noise is 6-12 dB below the target thermal noise. Thus, a desirable signal-to-noise (SNR) ratio for the ADC is about 60-65 dB. Each of the Graphs 410, 420, and 430 is a Fast Fourier Transform (FFT) plot that plots amplitude (measured in dB on Y-axis) versus frequency (measured in megahertz on X-axis).

As described earlier, the pipelined ADC 100 described with reference to FIGS. 1A and 1B, may enable the use of digital calibration in the digital error correction block 130 to counter the gain error introduced by the residue amplifiers. The benefits of using gain calibration to correct gain errors are illustrated by the graph 410. With a 10% gain error in the residual amplifier (but no non-linearity) digital calibration is effective and achieves 73 dB with the digital gain compensation, whereas without any digital calibration the SNR drops to 46 dB (which is less than the desirable SNR of 60-65 dB).

However, even if the gain error itself is calibrated, the non-linearity of the gain of the residue amplifier 180 may severely impact the overall performance of the pipelined ADC 100. Graph 420 illustrates the impact of the pipelined ADC 100 having gain calibration but having a non-linear gain of the residual amplifier 180. The SNR is limited to 56 dB even with gain error correction when a non-linear gain is introduced, e.g., the output compresses by 5% for full-scale input swing.

Graph 430 illustrates the improvement in noise performance of the pipelined ADC 200 with the PWL used for correcting the non-linear gain. A SNR for the pipelined is 65 dB compared to 56 dB for the ADC 100 with gain correction but without a non-linear gain correction (as shown in Graph 420). Thus a 9 dB improvement is achieved by using the simplified linear piecewise approximation technique. The SNR of 65 dB and the 9 dB improvement is sufficient to achieve the desirable 60-65 dB target to maintain the quantization noise 6-12 dB below the target thermal noise. If an ideal ADC model is used, e.g., by using a complex inverse non-linear filter with smoothly varying values implemented on an off-chip processor, the ideal SNR is computed to be about 72 dB. Thus, use of a piecewise linear approximation technique results in a performance penalty of 7 dB compared to the ideal ADC. However, the simplicity of implementing the PWL 310, e.g., by storing just 4 calibrated gain values in memory, provides significant benefits in terms of acceptable penalty in noise performance, significantly lower cost, significantly power consumption, and less silicon area, especially compared with an off-chip implementation.

An amplifier with poor distortion characteristics may provide the best results, e.g., greater than 9 dB improvement, with the piecewise linear compensation scheme. However, the piecewise compensation technique may also be used to target amplifier having less distortion characteristics as long as the ADC has sufficient bit resolution for quantization noise.

Figure 5:
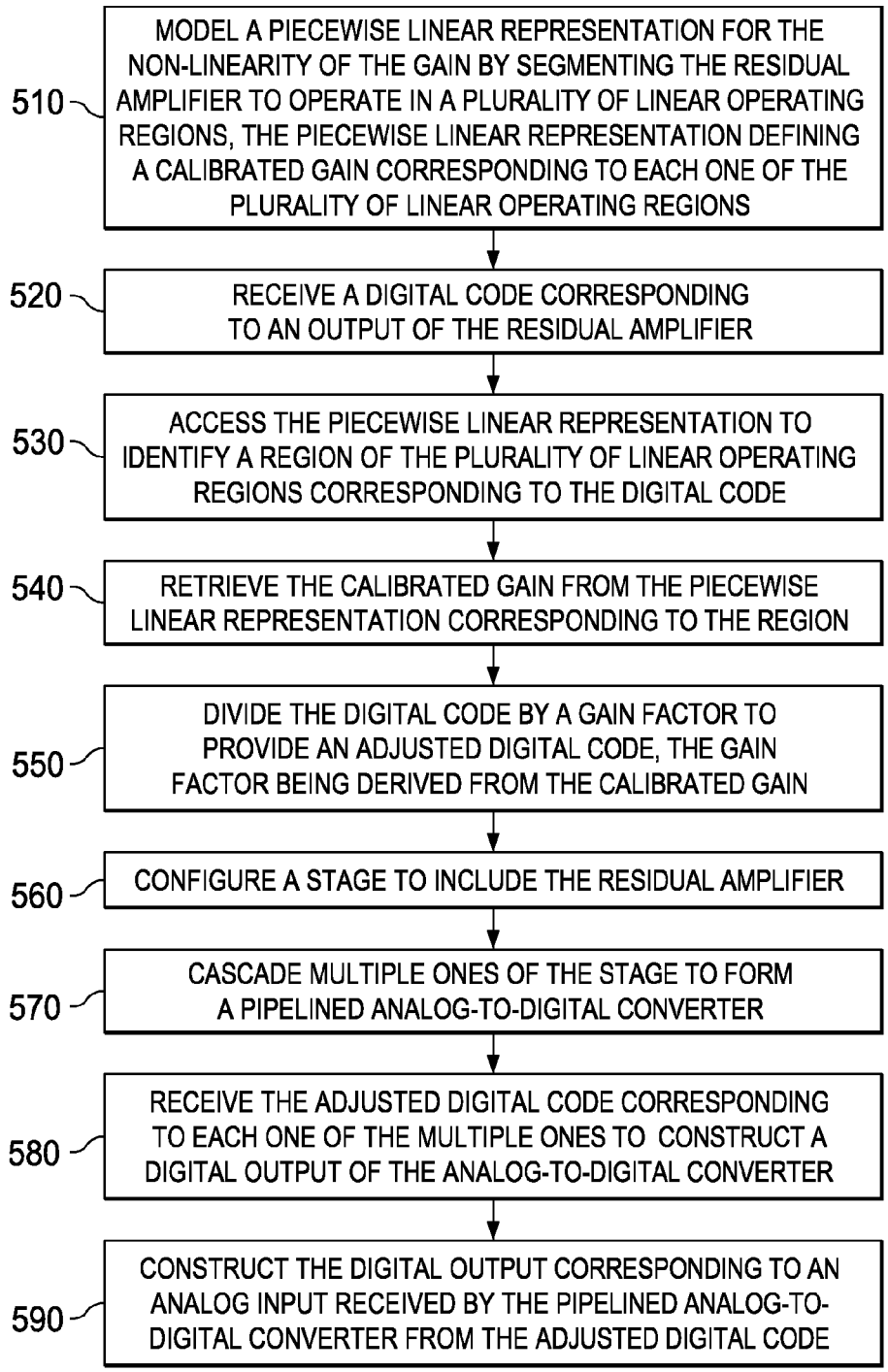
FIG. 5 is a flow chart illustrating a method for compensating non-linearity of a gain of a residual amplifier, according to an embodiment.

FIG. 5 is a flow chart illustrating a method for compensating non-linearity of a gain of a residual amplifier, according to an embodiment. In a particular embodiment, the method is used to compensate the non-linearity of the gain of the residual amplifier included in the pipelined ADC 200 described with reference to FIGS. 2, 3, and 4. At step 510, a piecewise linear (PWL) representation for the non-linearity of the gain is modeled by segmenting the residual amplifier to operate in a plurality of linear operating regions, the PWL representation defining a calibrated gain in each one of the plurality of linear operating regions. At step 520, a digital code corresponding to an output of the residual amplifier is received. At step 530, the PWL representation is accessed to identify a region of the plurality of linear operating regions corresponding to the digital code received. At step 540, the calibrated gain is retrieved from the PWL representation, the calibrated gain corresponding to the region. At step 550, the digital code is divided by a gain factor to provide an adjusted digital code, the gain factor being derived from the calibrated gain.

Various steps described above may be added, omitted, combined, altered, or performed in different orders. For example, steps 560, 570, 580, and 590 may be added after step 550. At step 560, a stage is configured to include the residual amplifier. At step 570, multiple ones of the stage are arranged in a cascaded manner to form a pipelined analog-to-digital converter (ADC). At step 580, the adjusted digital code corresponding to each one of the multiple ones is received to construct a digital output of the ADC. At step 590, the digital output corresponding to an analog input received by the pipelined ADC is constructed from the adjusted digital code.

Several advantages are achieved by the method and system according to the illustrative embodiments presented herein. The embodiments advantageously provide an improved method and apparatus for reducing gain error in a pipelined ADC introduced as a result of non-linear gain of a residual amplifier (RA) included in each stage of the ADC. The technique provides a piecewise linear (PWL) representation for modeling the non-linearity of the gain of the RA. Depending on an input to the RA, the RA is segmented to operate in one of a plurality of linear operating regions. The PWL representation defines a calibrated gain corresponding to each one of the plurality of linear operating regions. An average value of the calibrated gain corresponding to each one of the plurality of linear operating regions is stored in memory. A digital code for each stage of the ADC is adjusted for the non-linear gain in accordance with a gain factor derived from the calibrated gain for each stage. A digital output of the ADC is constructed from the adjusted digital code received from each stage. In a benchmarking test for comparing performance of: 1) a pipelined ADC with ideal (linear) amplifier, 2) a pipelined ADC with non-linear gain of amplifier, e.g., ADC 100, and 3) a pipelined ADC with PWL compensation for the non-linear gain of amplifier, a signal to noise ratio (SNR) for each of the three cases is 73 dB, 56 dB, and 65 dB respectively. Thus, a dramatic 9 dB improvement in the SNDR is achieved for the improved method and apparatus for reducing non-linear gain error compared to the traditional pipelined ADC 100 having a SNR of 56 dB. Thus, the improved technique advantageously provides modeling of the non-linear gain in the RA that is efficient in terms of simplicity in design and implementation, silicon area usage, power consumption usage, noise performance, and cost.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of a residual amplifier used in a pipelined ADC, those of ordinary skill in the art will appreciate that the apparatus and methods disclosed herein are capable of being implemented in any amplifier circuit having a non-linear gain.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for compensating non-linearity of a gain of a residual amplifier, the method comprising:

modeling a piecewise linear (PWL) representation for the non-linearity of the gain by segmenting the residual amplifier to operate in a plurality of linear operating regions, the PWL representation defining a calibrated gain corresponding to each one of the plurality of linear operating regions;

receiving a digital code corresponding to an output of the residual amplifier;

accessing the PWL representation to identify a region of the plurality of linear operating regions corresponding to the digital code;

retrieving the calibrated gain from the PWL representation corresponding to the region; and dividing the digital code by a gain factor to provide an adjusted digital code, the gain factor being derived from the calibrated gain.

2. The method of claim 1, wherein an average value of the calibrated gain corresponding to each one of the plurality of linear operating regions is stored in the PWL representation as a constant.

3. The method of claim 1, further comprising:

configuring a stage to include the residual amplifier;

cascading multiple ones of the stage to form a pipelined analog-to-digital converter (ADC); and receiving the adjusted digital code corresponding to each one of the multiple ones to construct a digital output of the ADC.

4. The method of claim 3, wherein the gain factor corresponding to a particular stage is dependent on the calibrated gain for the particular stage and each stage preceding the particular stage.

5. The method of claim 3, wherein a number of regions included in the plurality of linear operating regions is equal to 2 raised to n, n being equal to a number of bits per stage of the pipelined ADC, n being an integer.

6. The method of claim 3, wherein the gain factor for stage p of the pipelined ADC is derived by a multiplication of calibrated gains corresponding to stages p through p minus 1, p being an integer.

7. The method of claim 3, wherein the digital output of the ADC is constructed by concatenating the adjusted digital code corresponding to each one of the multiple ones, the multiple ones being arranged in accordance with the pipelined ADC.

8. The method of claim 1, wherein the dividing includes performing a shift right operation on the digital code, the gain factor being expressed as a multiple of 2.

9. The method of claim 1, wherein the dividing includes performing a shift right operation on the digital code to provide a right shifted digital code and performing a multiplication operation on the right shifted digital code.

10. An apparatus comprising:
a pipelined analog-to-digital converter (ADC) operable to convert an analog input to a digital output, wherein the ADC includes a plurality of pipelined stages (PPS) coupled in series, wherein each one of the PPS includes a residual amplifier, wherein each one of the PPS provides a digital code corresponding to at least a portion of the analog input; and
a digital output generator operable to receive the digital code from each one of the PPS and provide the digital output, wherein the digital output generator includes:
a memory to store a piecewise linear (PWL) representation of a calibrated gain of the residual amplifier corresponding to each region of a plurality of linear operating regions of the residual amplifier;
a gain adjuster to adjust the digital code in accordance with a gain factor derived from the calibrated gain for each one of the PPS, the gain adjuster providing an adjusted digital code for each one of the PPS;
a constructor to construct the digital output from the adjusted digital code received from each one of the PPS.

11. The apparatus of claim 10, wherein an average value of the calibrated gain corresponding to each one of the plurality of linear operating regions is stored in the PWL representation as a constant.

12. The apparatus of claim 10, wherein the gain factor corresponding to a particular stage is dependent on the calibrated gain for the particular stage and each stage preceding the particular stage.

13. The apparatus of claim 10, wherein a number of regions included in the plurality of linear operating regions is equal to 2 raised to n, n being equal to a number of bits per stage of the pipelined ADC, n being an integer.

14. The apparatus of claim 10, wherein the gain factor for stage p of the pipelined ADC is derived by a multiplication of calibrated gains corresponding to stages p through p minus 1, p being an integer.

15. The apparatus of claim 10, wherein the digital output of the ADC is constructed by concatenating the adjusted digital code corresponding to each stage of the PPS.

16. The apparatus of claim 10, wherein the gain adjuster includes a divider, the divider being operable to perform a divide operation by performing a shift right operation on the digital code, the gain factor being expressed as a multiple of 2.

17. The apparatus of claim 10, wherein the gain adjuster includes a divider and a multiplier, the divider being operable to perform a divide operation by performing a shift right operation on the digital code and the multiplier being operable to perform a multiplication operation on the right shifted digital code.

18. An apparatus comprising:
a memory to store a piecewise linear (PWL) representation of a calibrated gain of a residual amplifier corresponding to each region included in a plurality of linear operating regions of the residual amplifier; and
a gain adjuster to adjust a digital code representing an output of the residual amplifier, the digital code being adjusted in accordance with a gain factor derived from the calibrated gain, the gain adjuster operable to access the PWL stored in the memory to determine a region corresponding to the digital code and access the calibrated gain corresponding to the region.

19. The apparatus of claim 18, wherein an average value of the calibrated gain corresponding to each one of the plurality of linear operating regions is stored in the PWL representation as a constant.

20. The apparatus of claim 18, wherein a number of regions included in the plurality of linear operating regions is equal to 2 raised to n, n being equal to a number of bits per stage of the pipelined ADC, n being an integer.

* * * * *